United States Patent
Chang et al.

(10) Patent No.: US 12,084,766 B2
(45) Date of Patent: Sep. 10, 2024

(54) SEMICONDUCTOR DEVICE, METHOD, AND TOOL OF MANUFACTURE

(71) Applicant: Taiwan Semiconductor Manufacturing Company, Ltd., Hsinchu (TW)

(72) Inventors: Yung-Chang Chang, Taoyuan (TW); Meng-Yin Tsai, Kaohsiung (TW); Tung-Hsiung Liu, Tainan (TW); Liang-Yu Yeh, Taoyuan (TW); Chun-Yi Lee, Hsinchu (TW); Kuo-Hsi Huang, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 297 days.

(21) Appl. No.: 16/416,947

(22) Filed: May 20, 2019

(65) Prior Publication Data
US 2020/0017969 A1    Jan. 16, 2020

Related U.S. Application Data

(60) Provisional application No. 62/696,193, filed on Jul. 10, 2018.

(51) Int. Cl.
*C23C 16/455* (2006.01)
*C23C 16/52* (2006.01)
*H01L 21/02* (2006.01)

(52) U.S. Cl.
CPC .. *C23C 16/45553* (2013.01); *C23C 16/45527* (2013.01); *C23C 16/45548* (2013.01); *C23C 16/52* (2013.01); *H01L 21/0228* (2013.01)

(58) Field of Classification Search
None
See application file for complete search history.

(56) References Cited

U.S. PATENT DOCUMENTS 4,058,430 A * 11/1977 Suntola ............... C23C 14/24
                                                   148/DIG. 72
5,281,274 A *  1/1994 Yoder ................. C30B 29/36
                                                   118/724

(Continued)

FOREIGN PATENT DOCUMENTS

CN    105580103 A    5/2016
CN    107208266 A    9/2017

(Continued)

*Primary Examiner* — Karla A Moore
(74) *Attorney, Agent, or Firm* — Slater Matsil, LLP

(57) ABSTRACT

In an embodiment, an apparatus includes: a susceptor including substrate pockets; a gas injector disposed over the susceptor, the gas injector having first process regions, the gas injector including a first gas mixing hub and first distribution valves connecting the first gas mixing hub to the first process regions; and a controller connected to the gas injector and the susceptor, the controller being configured to: connect a first precursor material and a carrier gas to the first gas mixing hub; mix the first precursor material and the carrier gas in the first gas mixing hub to produce a first precursor gas; rotate the susceptor to rotate a first substrate disposed in one of the substrate pockets; and while rotating the susceptor, control the first distribution valves to sequentially introduce the first precursor gas at each of the first process regions as the first substrate enters each first process region.

20 Claims, 12 Drawing Sheets

(56) References Cited

U.S. PATENT DOCUMENTS

| | | | |
|---|---|---|---|
| 9,831,099 B2 | 11/2017 | O'Meara et al. | |
| 2003/0194493 A1* | 10/2003 | Chang | C23C 16/45519 |
| | | | 156/345.31 |
| 2004/0058293 A1* | 3/2004 | Nguyen | H01L 21/6719 |
| | | | 432/171 |
| 2006/0009034 A1* | 1/2006 | Lai | C23C 16/0281 |
| | | | 438/680 |
| 2007/0268675 A1 | 11/2007 | Chinda et al. | |
| 2008/0202610 A1* | 8/2008 | Gold | H01L 21/67109 |
| | | | 137/597 |
| 2015/0034008 A1* | 2/2015 | Jang | C23C 16/4401 |
| | | | 118/712 |
| 2015/0170908 A1* | 6/2015 | Hsueh | C23C 16/45565 |
| | | | 438/758 |
| 2015/0184289 A1* | 7/2015 | Lee | C23C 16/52 |
| | | | 118/710 |
| 2016/0215392 A1* | 7/2016 | Yudovsky | C23C 16/45561 |
| 2016/0322218 A1* | 11/2016 | Fukiage | H01J 37/3222 |
| 2018/0174885 A1* | 6/2018 | Chang | H01L 21/68764 |
| 2022/0364236 A1* | 11/2022 | Chang | C23C 16/45553 |

FOREIGN PATENT DOCUMENTS

| | | |
|---|---|---|
| CN | 107743529 A | 2/2018 |
| CN | 108070845 A | 5/2018 |
| TW | 201740431 A | 11/2017 |

* cited by examiner

SEMICONDUCTOR DEVICE, METHOD, AND TOOL OF MANUFACTURE

PRIORITY CLAIM AND CROSS-REFERENCE

This application claims the benefit of U.S. Provisional Application No. 62/696,193, filed on Jul. 10, 2018, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum feature sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
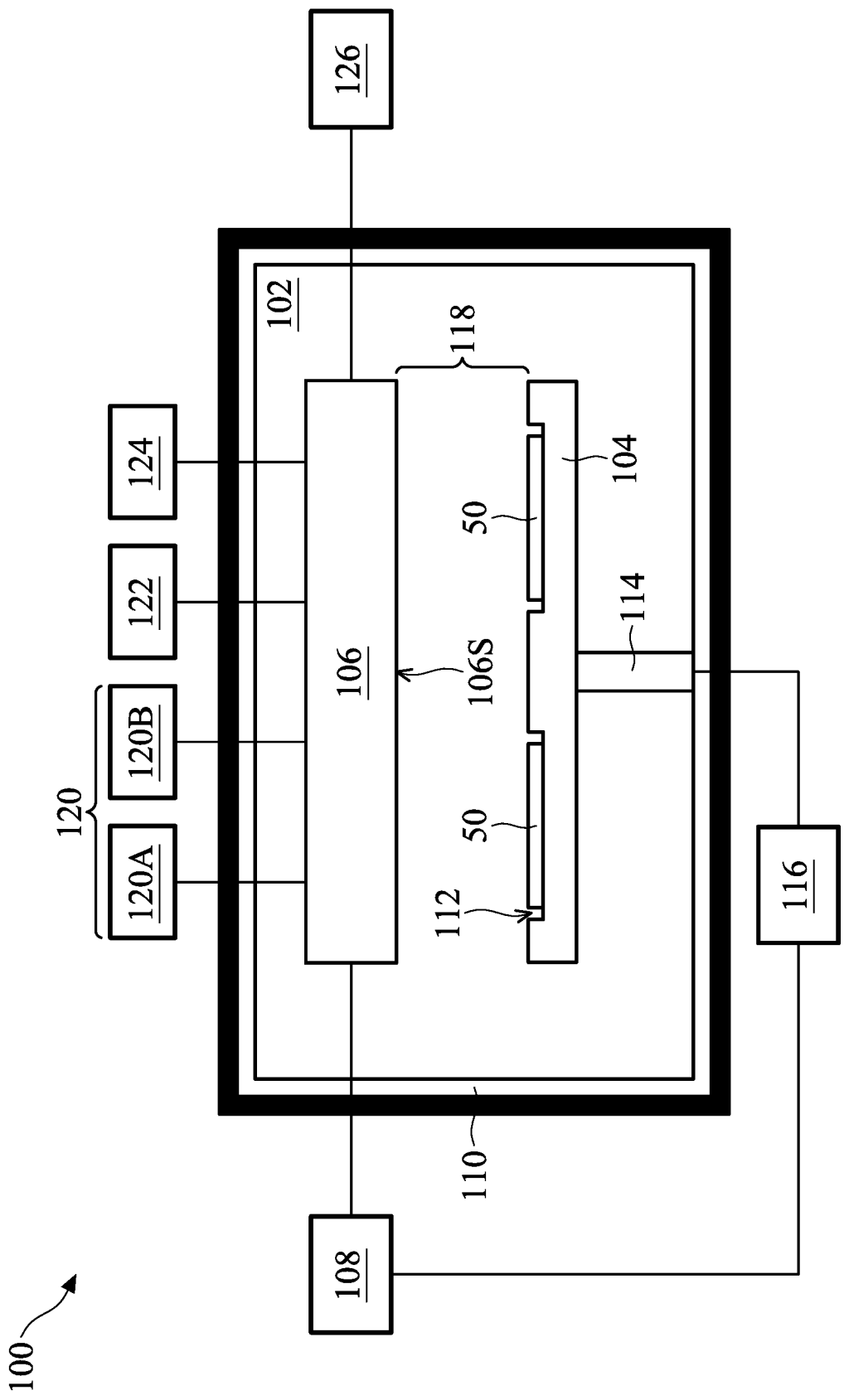
FIG. 1 illustrates aspects of a deposition system, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a gas injector of a deposition system includes additional precursor distribution valves after gas mixing hubs. The distribution valves are controlled by a controller, and allow precursor distribution to be precisely timed. During startup and shutdown sequences, the distribution valves are sequentially turned on or off as one or more substrates are rotated beneath the gas injector. By sequentially controlling the distribution valves, the entirety of the substrates are exposed to the precursor during the startup and shutdown sequences. The uniformity of a deposited layer may be improved, as compared to deposition systems where only portions of the substrates may be exposed to the precursor during the startup and shutdown sequences.

FIG. 1 illustrates aspects of a deposition system 100, in accordance with some embodiments. The deposition system 100 may be used to perform spatial atomic layer deposition (ALD). In spatial ALD, half-reactions of the ALD process are performed in different spatial regions (or locations) of a deposition chamber. Different areas of a susceptor are exposed to different precursors of the ALD process as the susceptor rotates in the deposition chamber. Spatial ALD may allow a more uniform film to be deposited than time-separated ALD, and may be faster than time-separated ALD. The deposition system 100 includes a deposition chamber 102 having a susceptor 104 and a gas injector 106 disposed therein. A controller 108 (described further below with respect to FIG. 4) is operable to control the various components of the deposition system 100. The deposition system 100 receives precursor materials to form a series of monolayers of materials. The monolayers of materials may be formed to cover one or more features formed on substrates 50 supported by the susceptor 104. Different precursor materials are supplied to different regions of the deposition chamber 102 over the susceptor 104 using the gas injector 106, and the susceptor 104 is rotated to sequentially expose the substrates 50 to each of the regions. Exhaust steps and purge steps may also be performed in other regions of the susceptor 104, such as between the regions where the precursor materials are dispensed.

The deposition chamber 102 receives the desired precursor materials and exposes the precursor materials to the substrates 50. The deposition chamber 102 may be any desired shape that may be suitable for dispersing the precursor materials and contacting the precursor materials with the substrates 50. In some embodiments, the deposition chamber 102 has a cylindrical sidewall and a bottom.

However, the deposition chamber 102 is not limited to a cylindrical shape, and any other suitable shape, such as a hollow cube, an octagonal prism, or the like, may be utilized. Furthermore, the deposition chamber 102 may be surrounded by a housing 110 made of material that is inert to the various process materials. The housing 110 may be formed from any suitable material that can withstand the chemistries and pressures involved in the deposition process. In some embodiments, the housing 110 is formed from steel, nickel, aluminum, combinations thereof, or the like.

The susceptor 104 is disposed in the deposition chamber 102, and has a plurality of pockets 112. The substrates 50 may be placed in the pockets 112 in order to position and control the substrates 50 during the deposition processes, as well as to rotate the substrates 50. The susceptor 104 may have any quantity of pockets 112. In some embodiments, the susceptor 104 has six pockets 112. The susceptor 104 may heat the substrates 50 during the deposition processes. The heat produced by the susceptor 104 may be controlled by the controller 108. The susceptor 104 is supported by a shaft 114, which may be used to raise, lower, and rotate the susceptor 104. A drive mechanism 116 may be coupled to the shaft 114. The drive mechanism 116 may include, e.g., one or more motors, and may be controlled by the controller 108 to rotate the susceptor 104 during the deposition processes. The susceptor 104 is separated from the gas injector 106 by a gap 118. During operation, the drive mechanism 116 may be further controlled by the controller 108 to raise and lower the susceptor 104, thereby increasing or decreasing the size of the gap 118.

The gas injector 106 may be any type of acceptable gas distribution assembly. The gas injector 106 has a front surface 106S facing the susceptor 104. The gas injector 106 may include showerheads, gas channels, or the like, for delivering precursor and purge gases to different regions of the susceptor 104. In the embodiment shown, the gas injector 106 is a single stationary injector unit. In some embodiments, the gas injector 106 includes multiple injector unit portions disposed around regions of the susceptor 104, such as around the edge of the susceptor 104.

The gas injector 106 receives precursor materials from precursor supplies 120, such as a first precursor supply 120A and a second precursor supply 120B. The gas injector 106 also receives a carrier gas from a carrier gas supply 122 and a purge gas from a purge gas supply 124. During operation, the gas injector 106 receives the precursor materials of the ALD process and the carrier gas, and mixes them to produce precursor gases. For example, a first precursor gas may be produced by mixing the material of the first precursor supply 120A with the carrier gas from the carrier gas supply 122, and a second precursor gas may be produced by mixing the material of the second precursor supply 120B with the carrier gas from the carrier gas supply 122.

The precursor supplies 120, carrier gas supply 122, and purge gas supply 124 may be vessels, such as gas storage tanks, that are either located locally to the deposition chamber 102 or are located remotely from the deposition chamber 102. Alternatively, the supplies may be facilities that independently prepare and deliver the precursor materials to the gas injector 106. Any suitable source for the precursor materials and carrier/purge gases may be utilized as the supplies. Although two precursor supplies 120 and one carrier gas supply 122 are shown, it should be appreciated that the deposition system 100 may include any quantity of supplies. Other embodiments may include a different quantity of supplies.

Further, the gas injector 106 is connected to a vacuum pump 126. The vacuum pump 126 helps evacuate exhaust gases from the deposition chamber 102, such as regions of the susceptor 104. The vacuum pump 126 may be controlled by the controller 108 to reduce and control the pressure within regions of the deposition chamber 102 to a desired pressure, and may also be utilized to evacuate precursor materials and purge gases from the deposition chamber 102.

The deposition system 100 may be used to deposit any materials. As an example, the deposition system 100 may be used to form a dielectric layer. In some embodiments, the deposition system 100 is used to form a layer of SiN or $Al_2O_3$. However, it should be appreciated that the deposition system 100 may be used to form other dielectric layers. Further, in some embodiments, other layers may be formed, such as barrier layers, conductive layers, gate dielectrics, etc. In embodiments where the deposition system 100 is used to form a layer of $Al_2O_3$, the first precursor material may be trimethylaluminum (TMA) and the second precursor material may be water ($H_2O$). Likewise, in embodiments where the deposition system 100 is used to form a layer of SiN, the first precursor material may be $NH_3$ and the second precursor material may be $SiH_2Cl_2$. Dielectric layers have many applications in semiconductor processing, and as an example, may be used to form gate spacers, etch stop layers, or other spacer layers. Such dielectric layers may be thin films, especially as semiconductor device sizes scale down. In some embodiments, thin film dielectric layers may have a thickness in the range of from about 30 Å to about 50 Å. Leakage in semiconductor devices such as transistors may be exacerbated as device sizes (and thus dielectric layers thicknesses) scale down. For example, with thinner gate spacers, leakage between the gate and source/drain of the transistor may increase, and variations in the gate spacer thickness may be more pronounced. Improving the uniformity of gate spacer thickness may help reduce leakage in smaller transistors and may increase manufacturing yield. Likewise, improving the uniformity of etch stop layers may allow improve the uniformity of subsequent etching processes.

Figure 2:
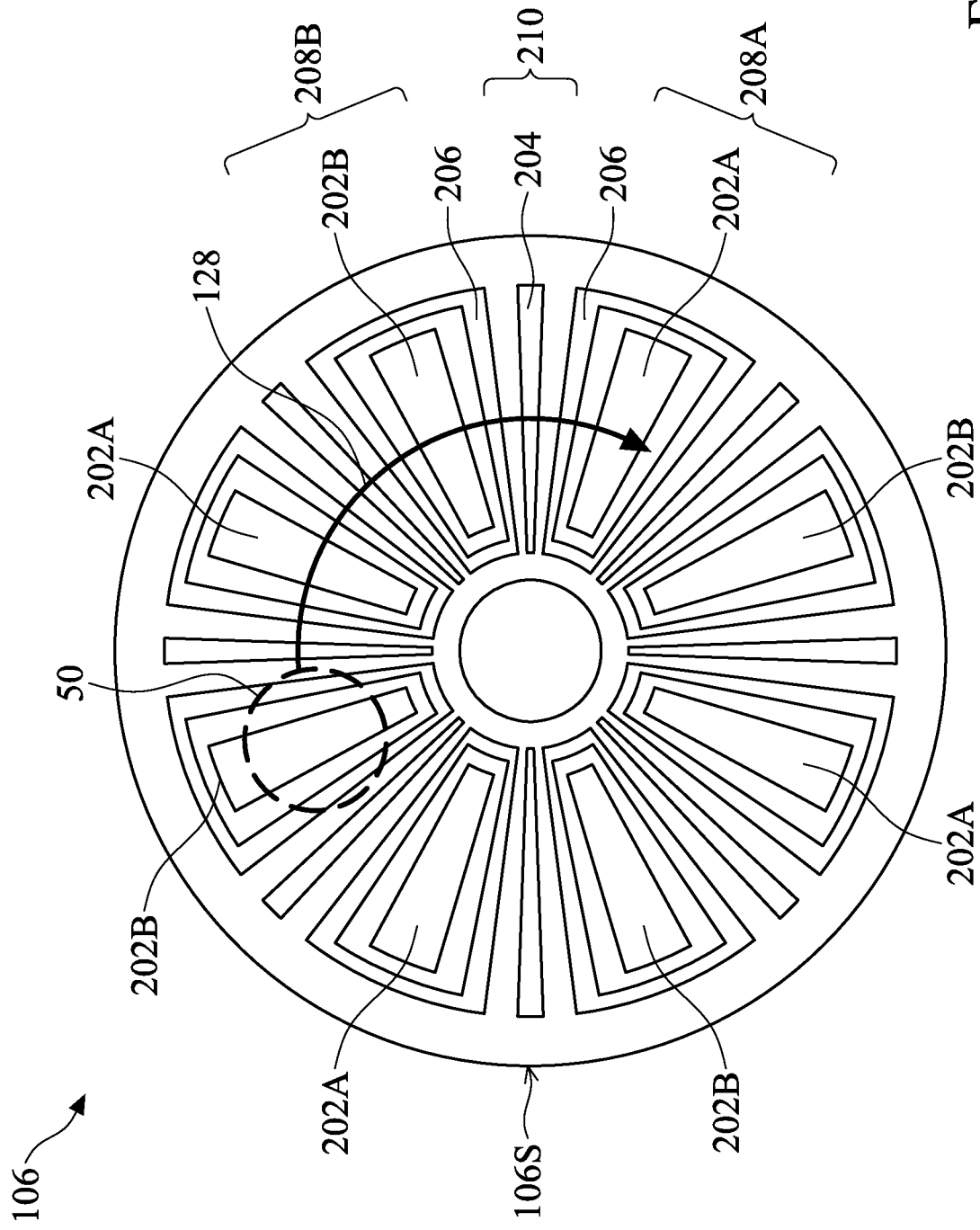
FIG. 2 illustrates aspects of a gas injector, in accordance with some embodiments.

FIG. 2 illustrates aspects of the gas injector 106, in accordance with some embodiments. The front surface 106S of the gas injector 106 is shown. The gas injector 106 includes precursor gas ports 202, such as first precursor gas ports 202A and second precursor gas ports 202B. The gas injector 106 further includes purge gas ports 204 and vacuum ports 206. During operation, the precursor gas ports 202, purge gas ports 204, and vacuum ports 206 are directed towards the susceptor 104.

The precursor gas ports 202 receive the precursor gases and expose different regions of the deposition chamber to the precursor gases. In the embodiment shown, the first precursor gas ports 202A receive the first precursor gas from the first precursor supply 120A, and the second precursor gas ports 202B receive the second precursor gas from the second precursor supply 120B.

The purge gas ports 204 are connected to the purge gas supply 124, and expose different regions of the deposition chamber 102 to the purge gas. The vacuum ports 206 are connected to the vacuum pump 126. When the vacuum pump 126 operates, the precursor and purge gases are evacuated from the deposition chamber 102 through the vacuum ports 206. Each one of the vacuum ports 206 is disposed around a respective one of the precursor gas ports 202. The purge gas ports 204 are disposed between respective pairs of the vacuum ports 206.

The gas injector 106 has process regions 208 and curtain regions 210. In the embodiment shown, the process regions 208 include first process regions 208A and second process regions 208B. Alternating ones of the process regions 208 are separated by the curtain regions 210, e.g., each one of the curtain regions 210 is disposed between one of the first process regions 208A and one of the second process regions 208B. In the process regions 208, the substrates 50 are exposed to precursors of the ALD process. In the embodiment shown, the substrates 50 are exposed to the first precursor gas in the first process regions 208A, and the substrates 50 are exposed to the second precursor gas in the second process regions 208B. In the curtain regions 210, the precursor gases are removed from the surfaces of the substrates 50. As used herein, a "curtain region" includes any combination of gas flows (e.g., purge gas flows) and/or vacuum(s) that separate the precursor gases of the different types of the process regions 208 and prevent or at least substantially reduce the likelihood of precursor gas mixing. The process regions 208 include respective ones of the precursor gas ports 202. In the embodiment shown, the first process regions 208A include the first precursor gas ports 202A, and the second process regions 208B include the second precursor gas ports 202B. Further, the curtain regions 210 include one of the purge gas ports 204, and include the vacuum ports 206 disposed around the precursor gas ports 202 of adjacent ones of the process regions 208.

During an ALD process, the substrates 50 are rotated beneath the gas injector 106, along a path 128 shown in FIG. 2. A relative position of one of the substrates 50 is shown as an example. As the substrates 50 are rotated, the top surfaces of the substrates 50 are exposed to the process regions 208 and the curtain regions 210. The substrates 50 are exposed, in alternating fashion, to one of the first process regions 208A (where a first half-reaction of the ALD process is performed), to one of the curtain regions 210 (where precursor gases of the first half-reaction are removed), to one of the second process regions 208B (where a second half-reaction of the ALD process is performed), and to another one of the curtain regions 210 (where precursor gases for the second half-reaction are removed). By exposing the substrate 50 to both a first process region 208A and a second process region 208B, a full reaction of the ALD process is performed on the substrate 50 After each full reaction of the ALD process, one monolayer is deposited over features of the substrate 50. In the embodiment shown, the gas injector 106 includes four first process regions 208A, four second process regions 208B, and eight curtain regions 210, which allows four monolayers to be deposited in each revolution of the susceptor 104. It should be appreciated that the gas injector 106 may include any quantity of process regions 208 and curtain regions 210.

Figure 3:
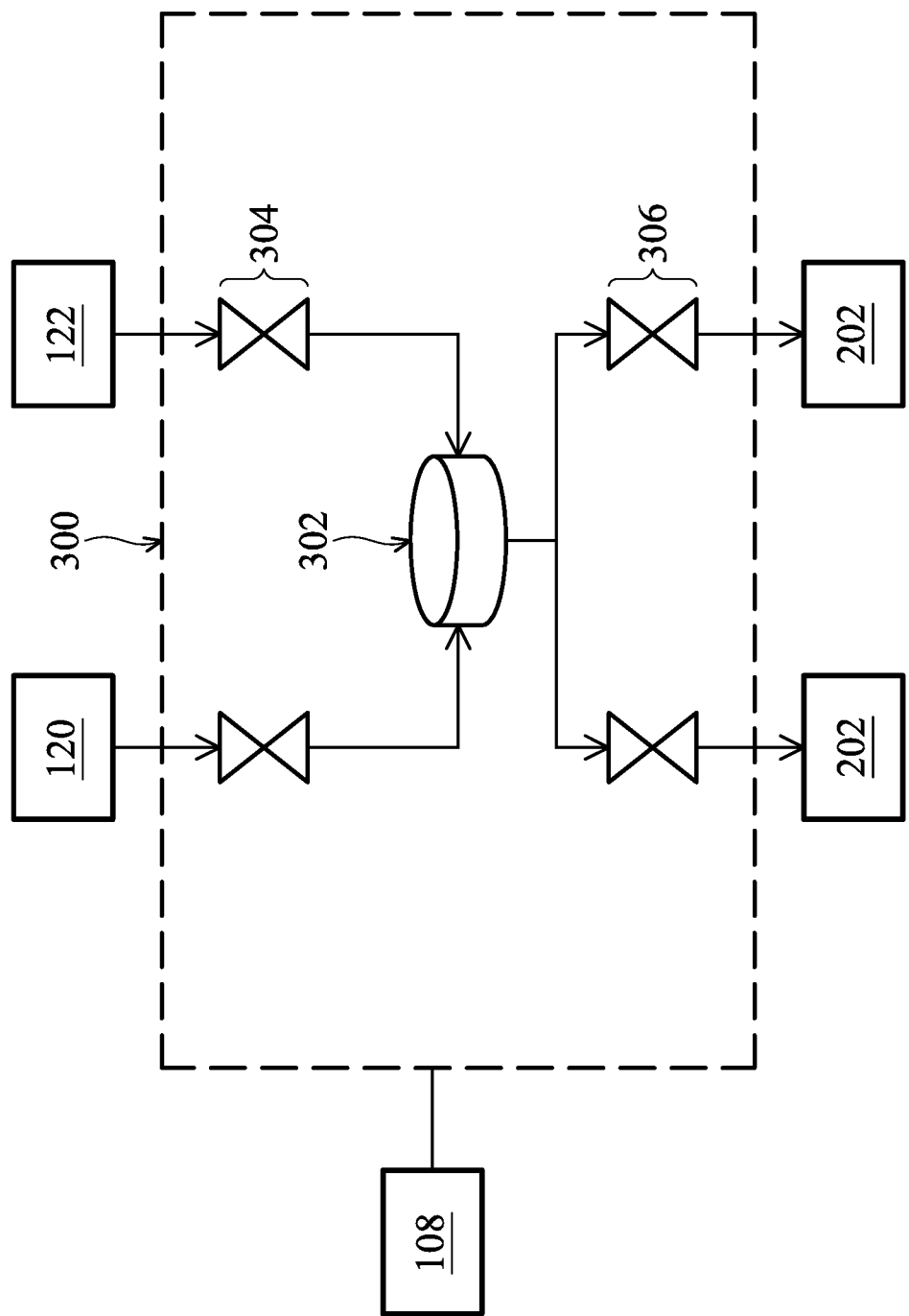
FIG. 3 illustrates aspects of a precursor delivery system, in accordance with some embodiments.

FIG. 3 illustrates aspects of a precursor delivery system 300, in accordance with some embodiments. The precursor delivery system 300 is part of the gas injector 106. The precursor delivery system 300 receives a precursor material from one of the precursor supplies 120, and a carrier gas from the carrier gas supply 122. A precursor gas is produced by mixing the precursor material and carrier gas, and the precursor gas is supplied to the precursor gas ports 202. The precursor supply 120 may be the first precursor supply 120A or the second precursor supply 120B, and the precursor gas ports 202 may, respectively, be the first precursor gas ports 202A or the second precursor gas ports 202B. The gas injector 106 includes one precursor delivery system 300 for each precursor used by the ALD process, which in some embodiments, may be two precursors. The precursor delivery system 300 includes a gas mixing hub 302, flow controllers 304, and distribution valves 306.

The gas mixing hub 302 receives a precursor material and the carrier gas. The precursor materials may be in a gas, solid, or liquid state, and may be mixed with the carrier gas to produce the precursor gas. When the precursor materials are in a solid or liquid state, the carrier gas may push and carry the precursors as they evaporate or sublimate into the precursor gas.

The flow controllers 304 are used to control the flow of the precursor material and the carrier gas to the gas mixing hub 302. The flow controllers 304 may be, e.g., proportional valves, modulating valves, needle valves, pressure regulators, mass flow controllers, combinations thereof, or the like.

The distribution valves 306 are used to control the flow of the precursor gas to the precursor gas ports 202. Notably, one of the distribution valves 306 is connected between the gas mixing hub 302 and one of the precursor gas ports 202. The distribution valves 306 are valves that actuate quickly in response to receiving control signals, such as pneumatic valves. In some embodiments, the actuation time of the distribution valves 306 is less than 1 second, which may allow the timing of precursor gas distribution to be precisely controlled. The distribution valves 306 are part of the gas injector 106, and are capable of withstanding high temperatures and operating under a high-pressure vacuum. In some embodiments, the distribution valves 306 are capable of withstanding temperatures in the range of from 100° C. to about 1000° C., and are capable of operating in a vacuum pressure of up to 100 torr. The distribution valves 306 are connected immediately after the gas mixing hub 302 such that when the distribution valves 306 are opened by a same amount, the volumetric flow of mixed gas through each of the distribution valves 306 may be substantially equal. Each of the distribution valves 306 has a corresponding process region 208 and the distribution values 306 are individually controlled by the controller 108 to dispense the precursor gas at different regions of the gas injector 106. In particular, the controller 108 may time the opening/closing of the distribution valves 306 during a startup and shutdown sequences of the deposition process to help improve the uniformity of a deposited film.

The components of the precursor delivery system 300 may be controlled by any controller. In the embodiment shown, the components are under control of the controller 108. It should be appreciated that the components may be under the control of different controllers. For example, the flow controllers 304 may be under control of a first controller (e.g., the controller 108), and the distribution valves 306 may be under control of a second controller that is different from the first controller. Any combination of controllers may be used, and the controllers may (or may not) communicate with one another during operation. As an example, the controllers may be electronic valve (EV) controllers. In some embodiments, the flow controllers 304 are under control of a first controller, which is located outside of the gas injector 106, and the distribution valves 306 are under control of a second controller, which is co-located with the distribution valves 306 in the gas injector 106.

Figure 4:
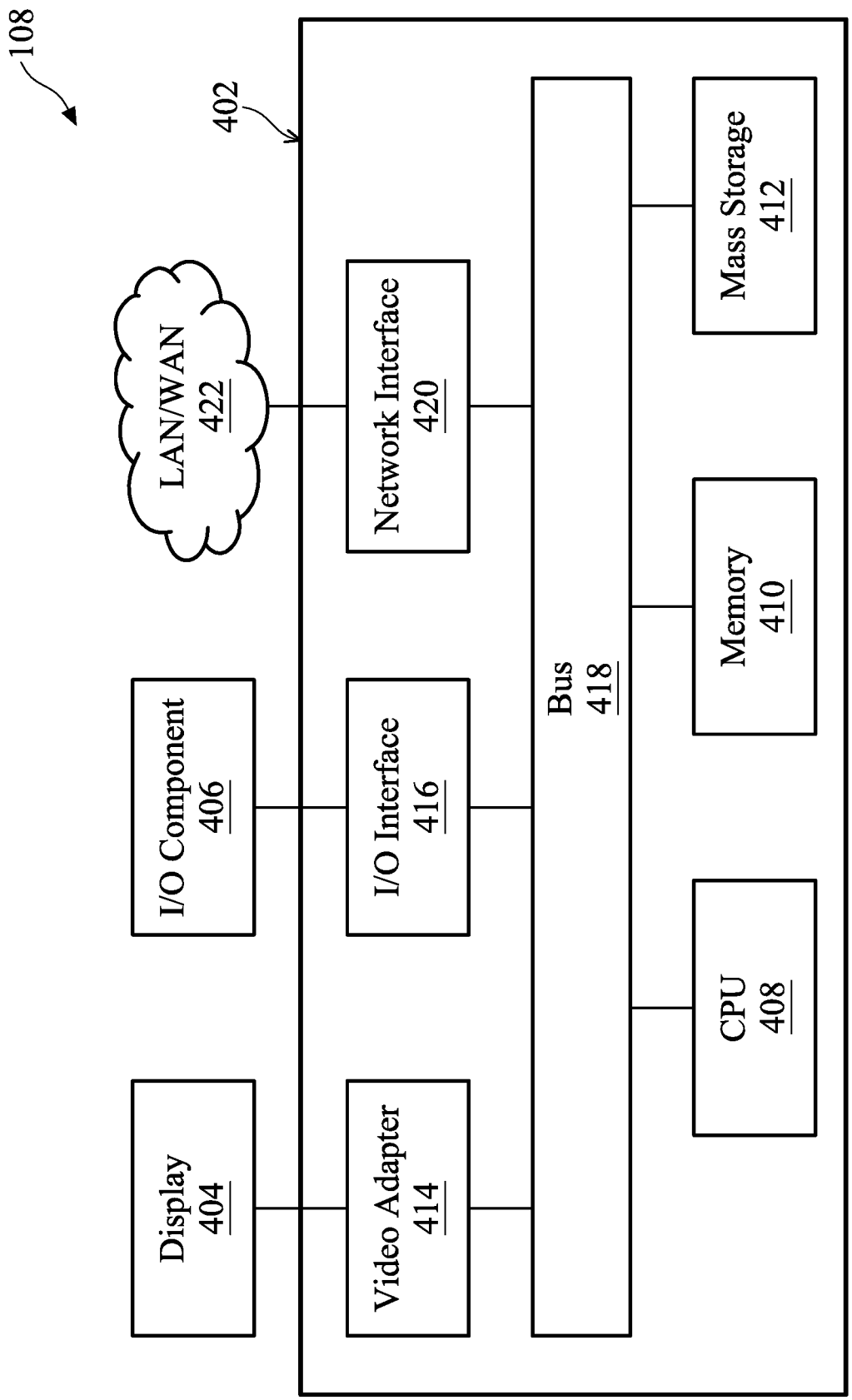
FIG. 4 illustrates aspects of a control unit, in accordance with some embodiments.

FIG. 4 illustrates aspects of the controller 108, in accordance with some embodiments. The controller 108 may be any form of computer processor that can be used in an industrial setting for controlling process machines. In an embodiment, the controller 108 comprises a processing unit 402, such as a desktop computer, a workstation, a laptop computer, or a dedicated unit customized for a particular application. The controller 108 may be equipped with a display 404 and one or more input/output components 406, such as instruction outputs, sensor inputs, a mouse, a keyboard, printer, combinations of these, or the like. The processing unit 402 may include a central processing unit (CPU) 408, memory 410, a mass storage device 412, a video adapter 414, and an I/O interface 416 connected to a bus 418.

The bus 418 may be one or more of any type of several bus architectures including a memory bus or memory controller, a peripheral bus, or video bus. The CPU 408 may comprise any type of electronic data processor, and the memory 410 may comprise any type of system memory, such as static random access memory (SRAM), dynamic random access memory (DRAM), or read-only memory (ROM). The mass storage device 412 may comprise any type of storage device configured to store data, programs, and other information and to make the data, programs, and other information accessible via the bus 418. The mass storage device 412 may comprise, for example, one or more of a hard disk drive, a magnetic disk drive, or an optical disk drive. The memory 410 and/or mass storage device 412 may be a non-transitory computer readable medium having programming stored thereon. The programming may comprise instructions that, when executed by the CPU 408, cause the controller 108 to perform the controlling functionality described herein.

The video adapter 414 and the I/O interface 416 provide interfaces to couple external input and output devices to the processing unit 402. As illustrated in FIG. 4, examples of input and output devices include the display 404 coupled to the video adapter 414 and the I/O component 406, such as a mouse, keyboard, printer, and the like, coupled to the I/O interface 416. Other devices may be coupled to the processing unit 402, and additional or fewer interface cards may be utilized. For example, a serial interface card (not shown) may be used to provide a serial interface for a printer. The processing unit 402 also may include a network interface 420 that may be a wired link to a local area network (LAN) or a wide area network (WAN) 422 and/or a wireless link.

It should be noted that the controller 108 may include other components. For example, the controller 108 may include power supplies, cables, a motherboard, removable storage media, cases, and the like. These other components, although not shown in FIG. 4, are considered part of the controller 108.

Figure 5:
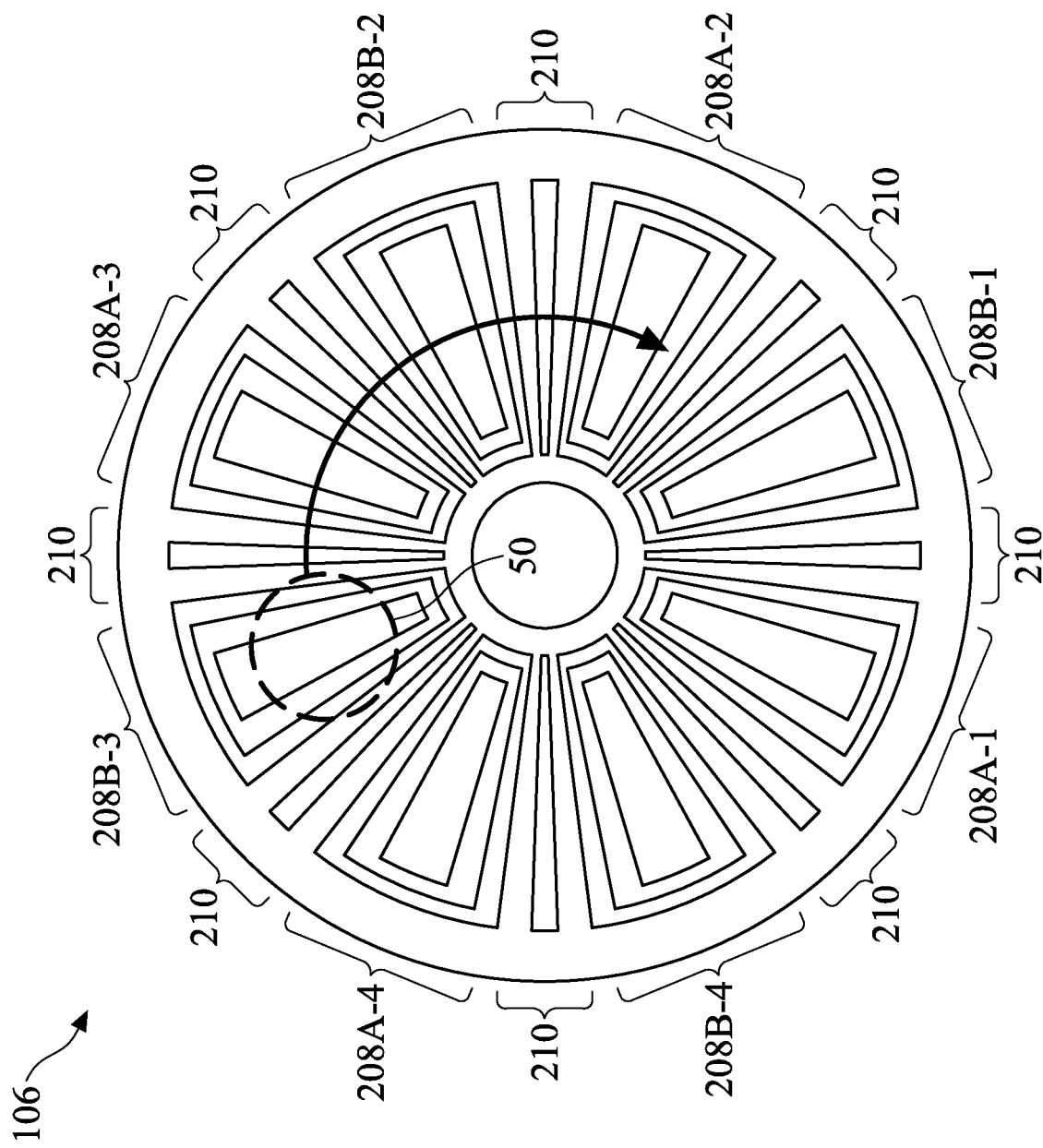
FIG. 5 illustrates different regions of a gas injector, in accordance with some embodiments.

FIG. 5 illustrates different regions of the gas injector 106 of FIG. 2, in accordance with some embodiments. In FIG. 5, all of the process regions 208 are illustrated. The first process regions 208A include first process regions 208A-1, 208A-2, 208A-3, and 208A-4. The second process regions 208B include second process regions 208B-1, 208B-2, 208B-3, and 208B-4. FIG. 5 is described in conjunction with FIG. 6.

Figure 6:
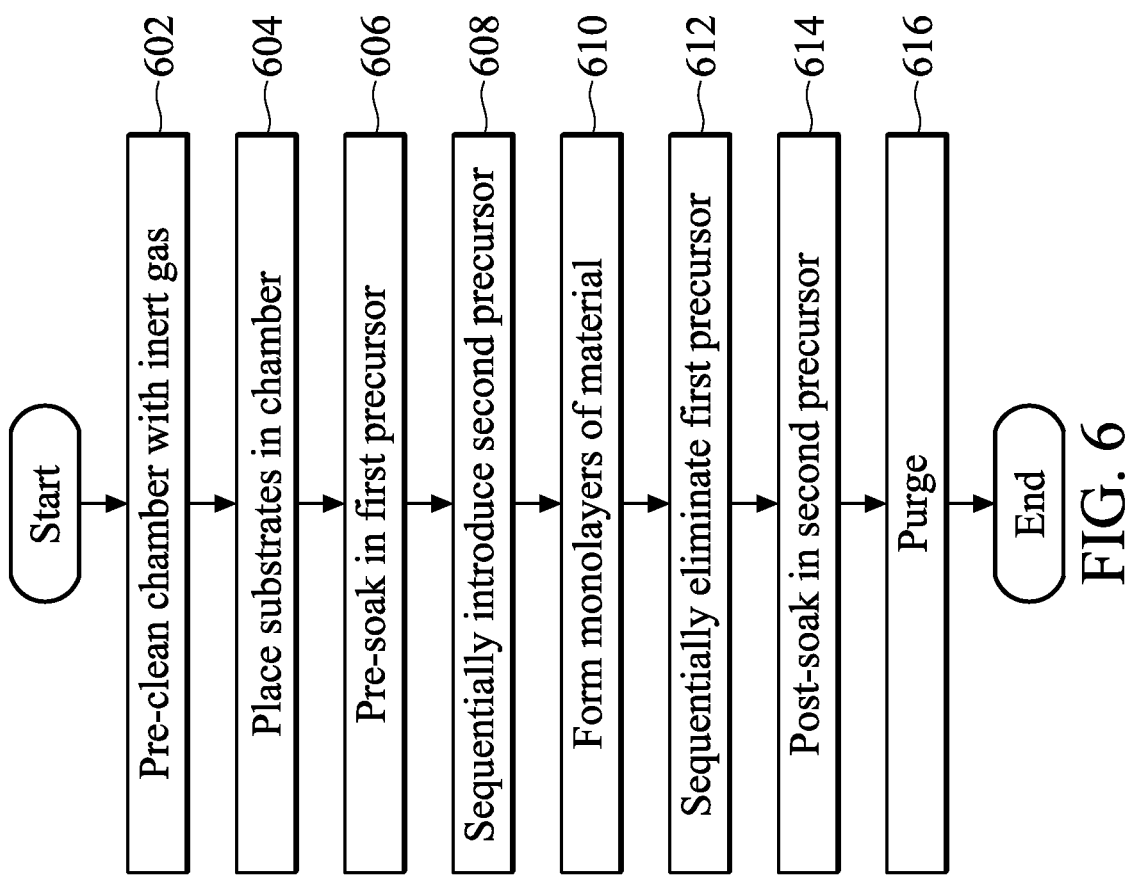
FIG. 6 is a flow diagram of a deposition method, in accordance with some embodiments.

FIG. 6 is a flow diagram of a deposition method 600, in accordance with some embodiments. The deposition method 600 is performed by the deposition system 100 when forming a series of monolayers of materials on the substrates 50, such as by the controller 108.

At the beginning of a deposition process, a pre-cleaning step is performed in the deposition chamber 102 (step 602). In some embodiments, the pre-cleaning step includes filling the deposition chamber 102 with an inert gas. The inert gas may be Ar, He, or the like. A vacuum may be performed to purge the inert gas and any impurities from the deposition chamber 102. Further, mixing of the first and second precursor gases may be started, which may be accomplished by turning on the flow controllers 304 of the precursor delivery systems 300 for the first and second precursor gases.

The substrates 50 are placed in the deposition chamber (step 604), such as in the pockets 112 of the susceptor 104. The susceptor 104 is then rotated under the gas injector 106. Rotation may be initiated, and may be performed for a predetermined amount of time before proceeding, to ensure the rotation speed of the susceptor 104 has stabilized.

A pre-soak process is performed using the first precursor (step 606). The pre-soak process is performed by turning on all of the process regions 208 associated with the first precursor, e.g., the first process regions 208A. The controller 108 turns on a given process region 208 by turning on the respective distribution valve 306 associated with that process region 208, thereby enabling the flow of the precursor gas to that process region 208. Likewise, the controller 108 turns off a given process region 208 by turning off the respective distribution valve 306 associated with that process region 208, thereby disabling the flow of the precursor gas to that process region 208. The flow of the precursor gas to that process region 208 is thus disabled. The substrates 50 may be rotated for a predetermined quantity of time so that they are soaked in the first precursor gas. For example, in embodiments where $Al_2O_3$ is formed, the first process regions 208A are turned on to soak the substrates 50 in TMA gas.

The second precursor is sequentially introduced (step 608). The second precursor is introduced by turning on all of the process regions 208 associated with the second precursor, e.g., the second process regions 208B. As the susceptor 104 rotates, the second process regions 208B are turned on one-by-one. The second process regions 208B are each turned on as a first one of the substrates 50 enters respective ones of the second process regions 208B. The first substrate may be referred to as the "leading substrate," as it is the first one of the substrates 50 that will be exposed to the second precursor, and other ones of the substrates 50 will be exposed to the second precursor after the leading substrate.

For example, the second process region 208B-1 is turned on as the leading edge of the leading substrate enters the coverage of the second process region 208B-1. The leading substrate is thus exposed to the second precursor. The second process region 208B-1 remains on as the leading substrate exits it, so that other substrates 50 after the leading substrate are exposed to the second precursor. The second process region 208B-2 is then turned on as the leading substrate enters it, and remains on as the leading substrate exits it. The second process region 208B-3 is then turned on as the leading substrate enters it, and remains on as the leading substrate exits it. The second process region 208B-4 is then turned on as the leading substrate enters it, and remains on as the leading substrate exits it. After each respective one of the second process regions 208B are turned on, they remain on.

Determining when the leading substrate enters each of the second process regions 208B may be accomplished in any manner. As an example, the starting position and the rotation speed of the susceptor 104 may be known values. The positions of the substrates 50 relative to the process regions 208 may thus be computed in real-time based on the known speed and starting positions of the substrates 50. The timing for sequentially turning on the distribution valves 306 may be controlled according to the position and rotation speed of the susceptor 104. In other words, the time span between actuation of each of the distribution valves 306 may be determined according to the position and rotation speed of the susceptor 104

Monolayers of the desired material are formed on the substrates 50 (step 610). One monolayer is formed each time the substrates 50 enter one of the first process regions 208A and one of the second process regions 208B. The susceptor 104 may be rotated for as many revolutions as needed to produce a desired thickness of the material layer. In some embodiments, the controller 108 determines a needed quantity of revolutions based on the desired thickness of the material layer. The susceptor 104 is then rotated that quantity of revolutions. For example, the controller 108 may compute $$r = \frac{t_d}{t_m \times q_r},$$

the quantity of revolutions according to where r is the quantity of revolutions, $t_d$ is the desired thickness of the material layer, $t_m$ is the thickness of a single monolayer of the material, and $q_r$ is the quantity of process regions 208A/208B of the gas injector 106.

The first precursor is sequentially eliminated (step 612). The first precursor is eliminated by turning off all of the process regions 208 associated with the first precursor, e.g., the first process regions 208A. As the susceptor 104 rotates, the first process regions 208A are turned off one-by-one. The first process regions 208A are each turned off as the leading edge of the leading substrate enters respective ones of the first process regions 208A. For example, the first process region 208A-1 is turned off as the leading substrate enters it. The leading substrate is thus no longer exposed to the second precursor. The first process region 208A-1 remains off as the leading substrate exits it, so that other substrates 50 after the leading substrate are also not exposed to the first precursor. The first process region 208A-2 is then turned off as the leading substrate enters it, and remains off as the leading substrate exits it. The first process region 208A-3 is then turned off as the leading substrate enters it, and remains off as the leading substrate exits it. The first process region 208A-4 is then turned off as the leading substrate enters it, and remains off as the leading substrate exits it. After all of the first process regions 208A are turned off, they remain off. Determining when the leading substrate enters each of the first process regions 208A may be accomplished in a similar manner as determining when the leading substrate enters the second process regions 208B. The timing for sequentially turning off the distribution valves 306 may be determined according to the position and rotation speed of the susceptor 104.

A post-soak process is performed using the second precursor (step 614). The post-soak is performed once all of the process regions 208 associated with the first precursor, e.g., the first process regions 208A, are turned off. The process regions 208 associated with the second precursor, e.g., the second process regions 208B, remain on. The substrates 50 may thus be soaked in the second precursor gas. For example, in embodiments where $Al_2O_3$ is formed, the second process regions 208B remain turned on to soak the substrates 50 in $H_2O$ gas.

A purge of the deposition chamber 102 is performed (step 616). The purge may be performed by again filling the deposition chamber 102 with an inert gas. The inert gas may be Ar, He, or the like. A vacuum may be performed to purge the inert gas and any remaining precursor gases. The substrates 50 may then be removed from the deposition chamber 102.

Sequentially introducing the second precursor to the substrates 50 after pre-soaking the substrates 50 in the first precursor may improve the uniformity of the formed material layer. Some ALD processes have a high deposition rate. By sequentially turning on the second process regions 208B, a partial exposure of the substrates 50 to precursor gases may be avoided. For example, if the second process regions 208B were all turned on at the same time, at least one of the substrates 50 may not be positioned entirely under one of the second process regions 208B, such as when the quantity of pockets 112 in the susceptor 104 is not equal to a multiple of the quantity of process regions 208. Continuing the above example, when there are six pockets 112 and eight process regions 208, at least one of the substrates 50 will always be partially disposed outside one of the process regions 208. Only a portion of that substrate would be exposed to the second precursor gas, resulting in a non-uniform material layer being formed on that substrate. In an example where the desired material layer was a thin dielectric layer (e.g., a 30 Å thick layer of $Al_2O_3$), the uniformity of thickness was improved by as much as 370%.

Figure 7A:
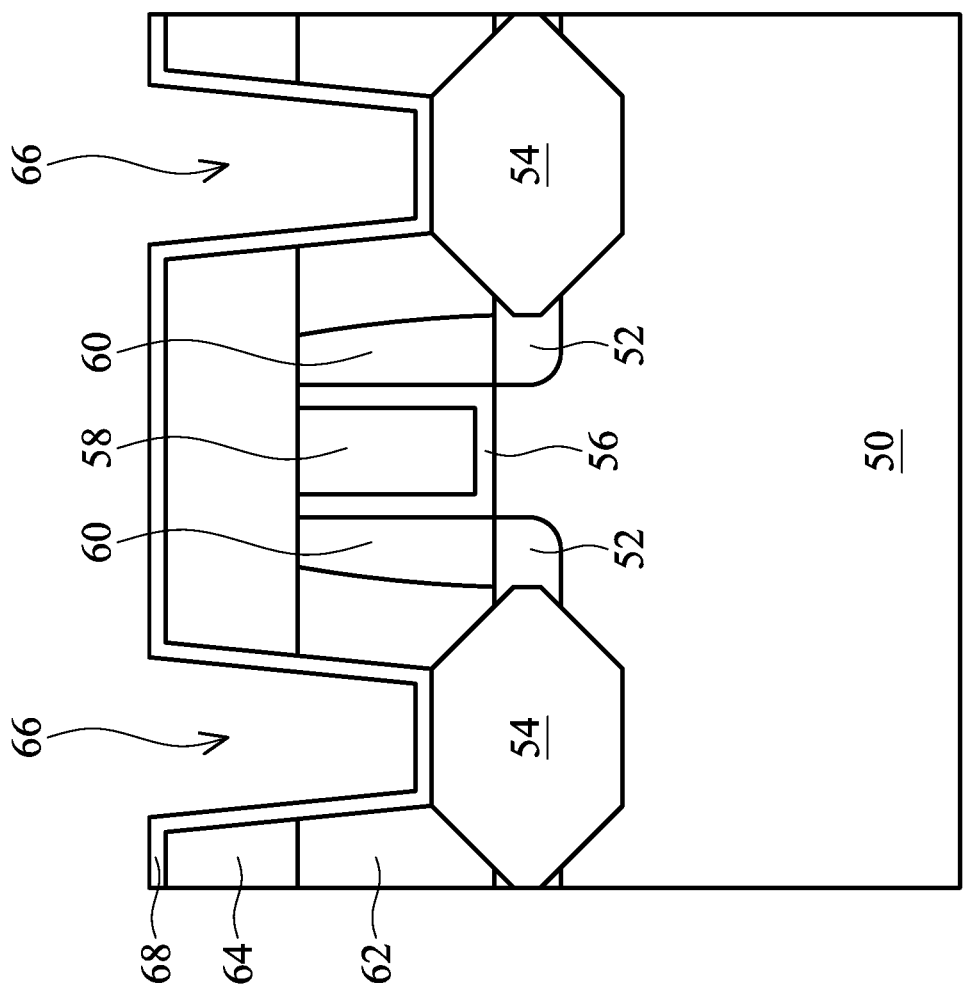
FIGS. 7A through 7C are cross-sectional views of intermediate steps of a process for manufacturing semiconductor devices, in accordance with some embodiments.
Figure 7B:
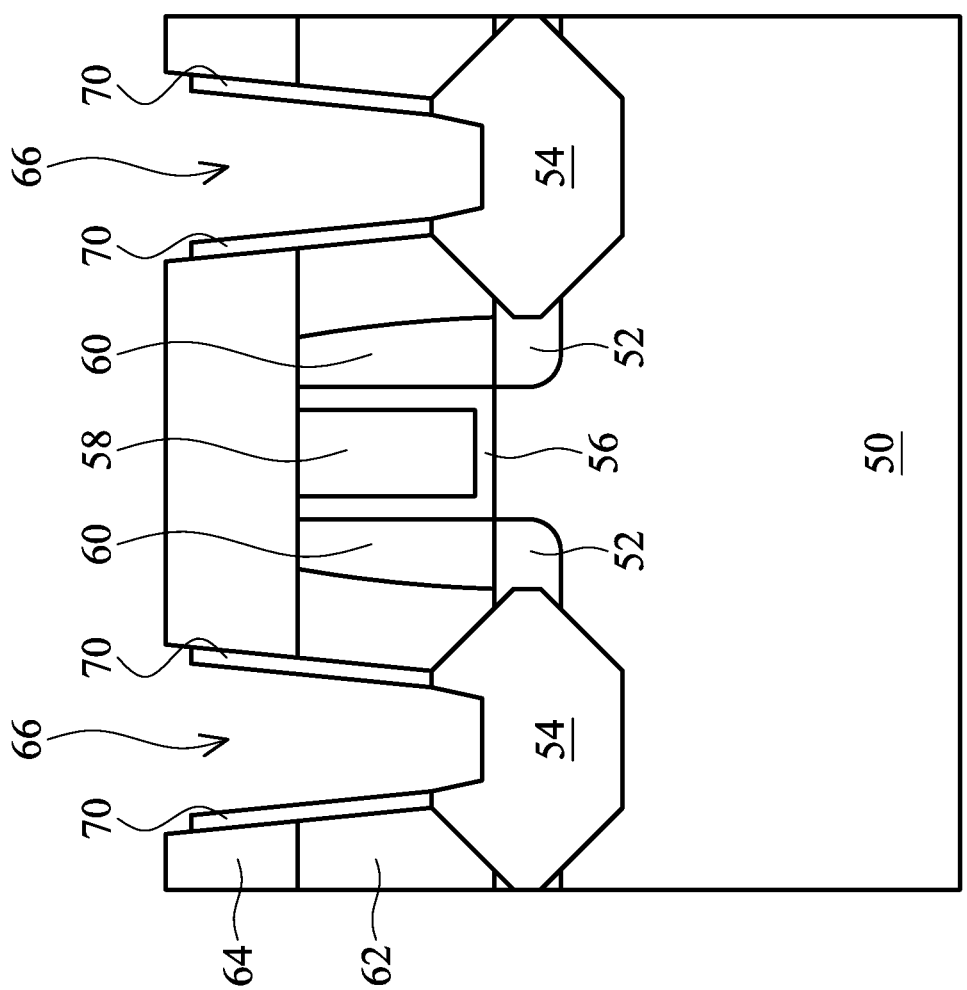
Figure 7C:
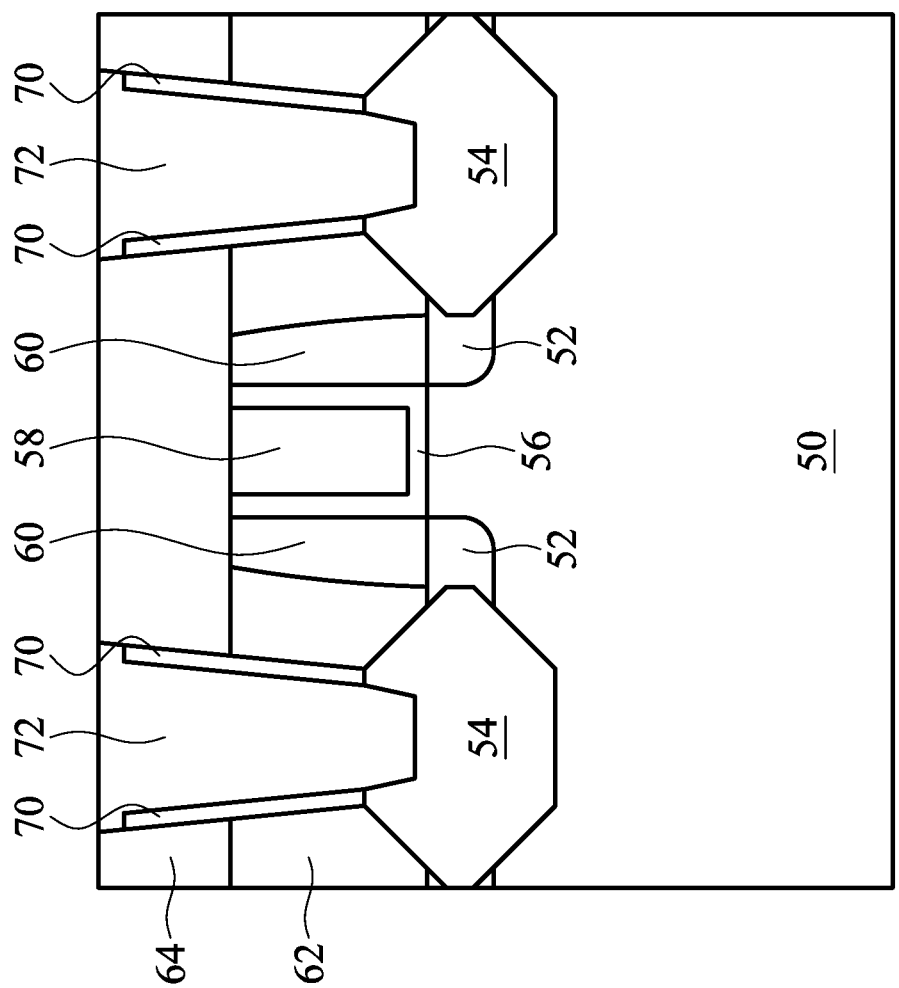

FIGS. 7A through 7C are cross-sectional views of intermediate steps of a process for manufacturing semiconductor devices on the substrates 50, in accordance with some embodiments. The semiconductor devices may be, e.g., FinFETs, and the substrates 50 may comprise semiconductor strips extending from a bulk substrate. Lightly doped source/drain regions 52 and epitaxial source/drain regions 54 are formed in the substrates 50. Gate stacks including gate dielectric layers 56 and gate electrodes 58 are formed over the channel regions of the substrates 50, between the epitaxial source/drain regions 54. Gate spacers 60 extend along sides of the gate stacks. A first inter-layer dielectric (ILD) 62 is formed over the epitaxial source/drain regions 54 and along sides of the gate spacers 60. A second ILD 64 is formed on the first ILD 62.

In FIG. 7A, openings 66 are formed in the ILDs 62 and 64. The openings 66 may be formed by, e.g., acceptable photolithography and etching processes. A spacer layer 68 may be formed in the openings 66. The spacer layer 68 may be formed by spatial ALD using the deposition system 100. In some embodiments, the spacer layer 68 comprises $Al_2O_3$, and during the spatial ALD, the first precursor is TMA and the second precursor is $H_2O$. When the spacer layer 68 is formed, the susceptor 104 may be rotated at a rotation speed in the range of from about 5 RPM to about 20 RPM. The deposition chamber 102 may have a temperature in the range of from about 250° C. to about 400° C., and at a pressure in the range of from about 10 torr to about 30 torr. Such processing parameters may allow a thin spacer layer 68 to be formed in the openings 66. For example, the thickness of the spacer layer 68 may be in the range of from about 30 Å to about 50 Å.

In FIG. 7B, an etching process is performed to remove horizontal portions of the spacer layer 68, leaving remaining vertical portions of the spacer layer 68 in the openings 66. The etching may be by an anisotropic etching process, such as a wet or dry etch. The remaining vertical portions of the spacer layer 68 are additional contact spacers 70 that help prevent shorting of the gate electrodes 58. In some embodiments, the contact spacers 70 have top surfaces that are below the top surfaces of the second ILD 64. Because the original spacer layer 68 has improved uniformity, the contact spacers 70 also have improved uniformity in both their thickness and height, and may therefore improve the physical separation between contacts for the epitaxial source/drain regions 54 and the gate electrodes 58. Shorting between the epitaxial source/drain regions 54 and the gate electrodes 58 may thus be avoided.

In FIG. 7C, contacts 72 are formed in the openings 66. A liner, such as a diffusion barrier layer, an adhesion layer, or the like, and a conductive material are formed in the openings 66. The liner may include titanium, titanium nitride, tantalum, tantalum nitride, or the like. The conductive material may be copper, a copper alloy, silver, gold, tungsten, aluminum, nickel, or the like. A planarization process, such as a CMP, may be performed to remove excess material from a surface of the second ILD 64. The remaining liner and conductive material form the contacts 72 in the openings. An anneal process may be performed to form a silicide at the interface between the epitaxial source/drain regions 54 and the contacts 72. The contacts 72 are physically and electrically coupled to the epitaxial source/drain regions 54.

Figure 8A:
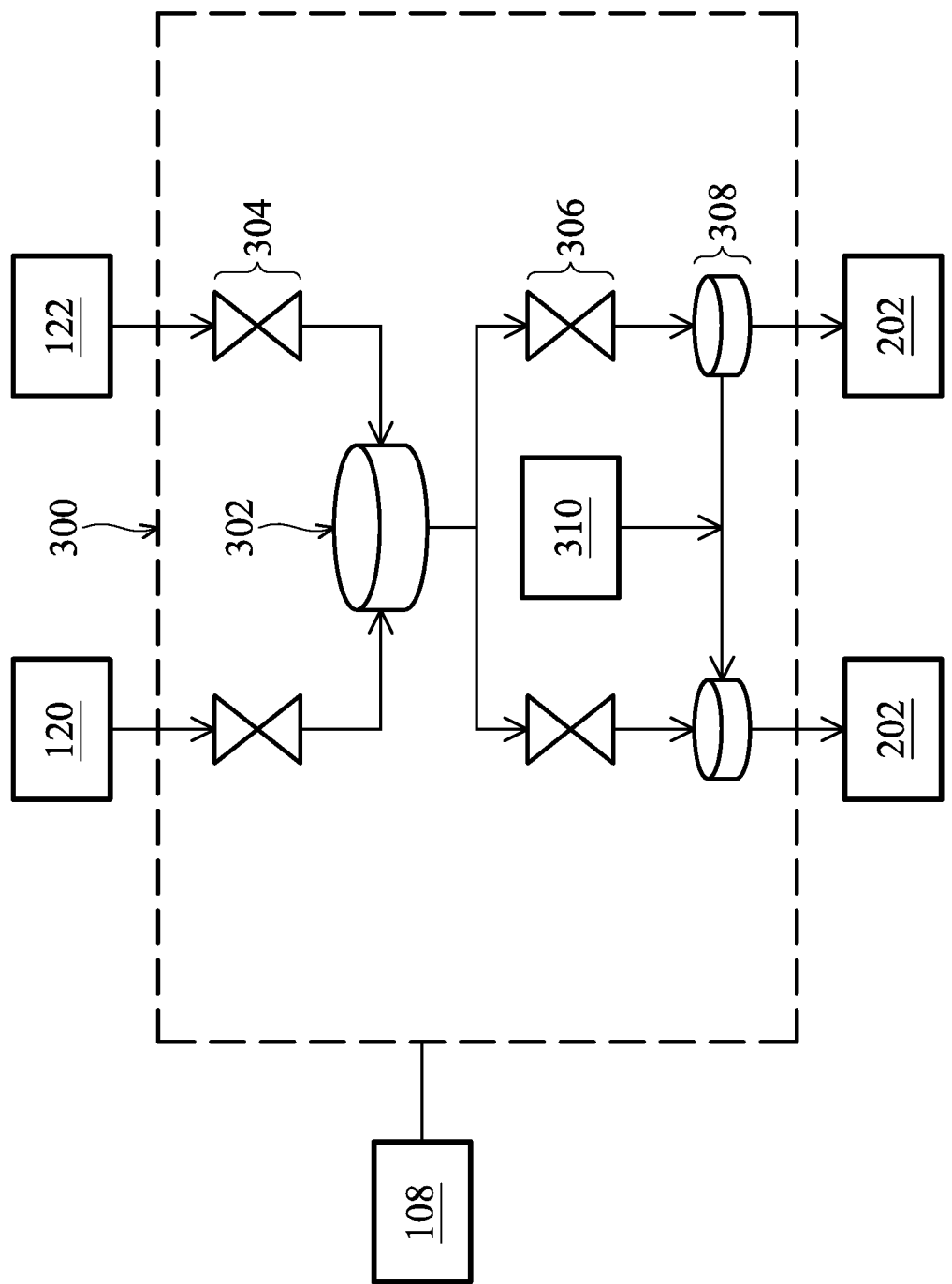
FIGS. 8A and 8B illustrate aspects of a precursor delivery system, in accordance with some other embodiments.
Figure 8B:
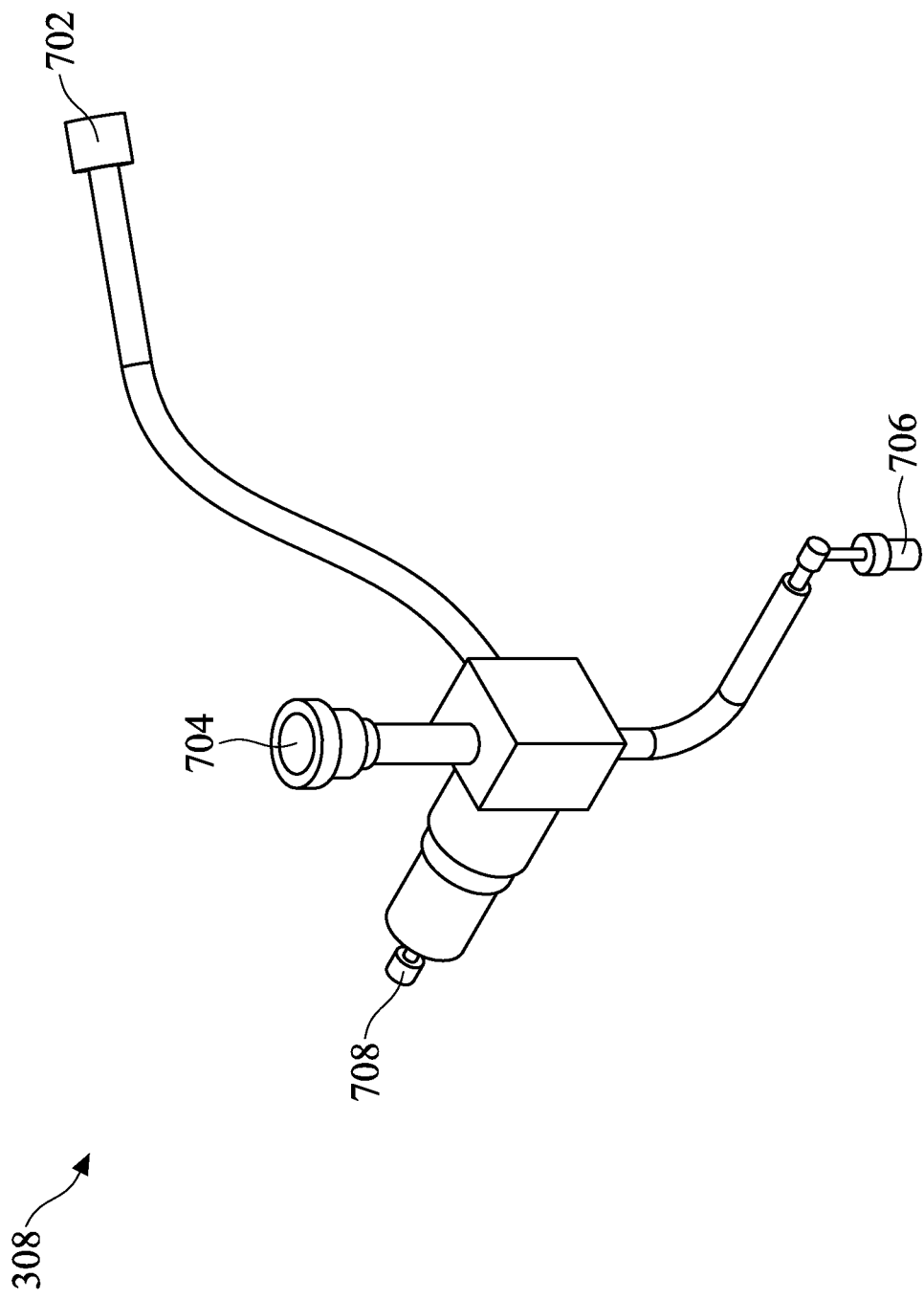

FIG. 8A illustrates aspects of the precursor delivery system 300, in accordance with some other embodiments. In this embodiment, the precursor delivery system 300 further includes dilution mixers 308 connected between the distribution valves 306 and the precursor gas ports 202. The dilution mixers 308 are connected to a dilution gas source 310, and further dilute the precursor gases before they are distributed at the precursor gas ports 202. In some embodiments, the carrier gas is used for the dilution, and the dilution gas source 310 is the same as the carrier gas supply 122. In some embodiments, the dilution gas source 310 provides a mix of water ($H_2O$) and nitrogen ($N_2$). For example, the dilution gas source 310 may provide a mix that includes about 10 mg of water mixed with nitrogen at a flow rate of about 100 sccm. The dilution gas source 310 may include flow controllers for the sources, such as a liquid flow meter (LFM) for water and a mass flow controller (MFC) for nitrogen. The dilution mixers 308 may be showerheads or other gas mixing devices. An example of a dilution mixer 308 is shown in FIG. 8B. The dilution mixer 308 includes a precursor gas port 702, a dilution gas port 704, and an output port 706. The precursor gas port 702 is connected to a respective distribution valve 306, and receives the precursor gas. The dilution gas port 704 is connected to the dilution gas source 310, and receives the dilution gas, with which the precursor gas will be diluted. The output port 706 is connected to the precursor gas ports 202 of the gas injector 106, and supplies the diluted precursor gas. Optionally, in some embodiments, the dilution mixer 308 further includes a control port 708. The control port 708 allows adjustment of the flow rate at the output port 706, and may be controlled by a controller such as the controller 108.

Figure 9:
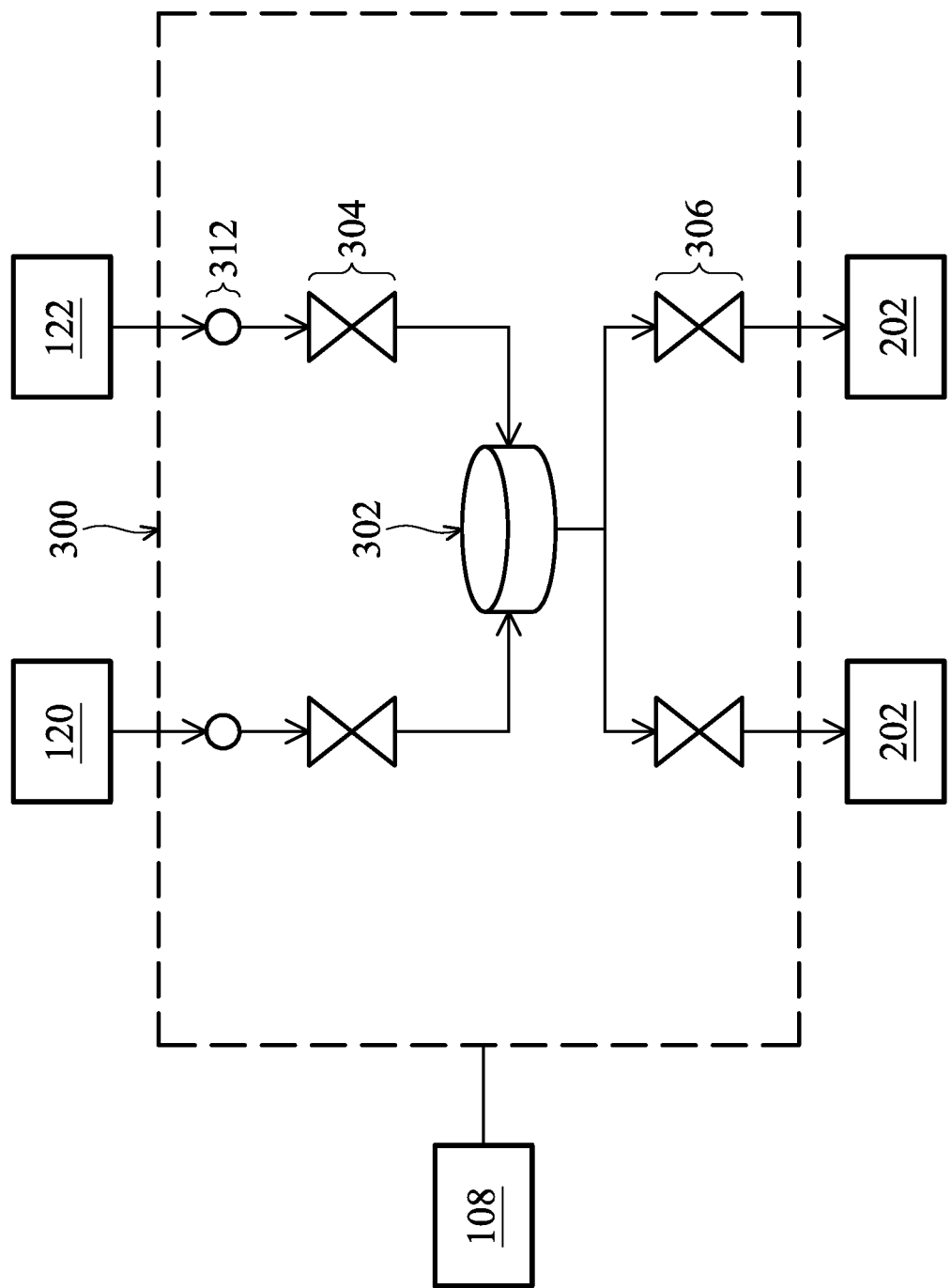
FIG. 9 illustrates aspects of a precursor delivery system, in accordance with some other embodiments.

FIG. 9 illustrates aspects of the precursor delivery system 300, in accordance with some other embodiments. In this embodiment, the precursor delivery system 300 further includes pressure monitors 312. The pressure monitors 312 may be, e.g., gas pressure gauges. The pressure monitors 312 are connected between the flow controllers 304 and the precursor supplies 120, and between the flow controllers 304 and the carrier gas supply 122. When the distribution valves 306 are opened and closed, abrupt changes in gas pressure may occur in the gas mixing hub 302 and associated gas lines. A controller (e.g., the controller 108) monitors the gas pressures with the pressure monitors 312. During normal operation, some change in pressure is expected. However, abnormal changes in pressure may indicate errors in the timing for sequentially turning on/off the distribution valves 306 and/or failure of the distribution valves 306. In some embodiments, when the pressure monitors 312 detect a pressure increase greater than a predetermined threshold, the controller may perform a timing calibration process. The timing for sequentially turning on/off the distribution valves 306 may be adjusted during the calibration process. In some embodiments, when the pressure monitors 312 detect a pressure increase greater than a predetermined threshold, processing may be stopped altogether. The predetermined threshold may be a pressure level that is much higher than normal pressure variations. In some embodiments, the predetermined threshold may be in the range of from about 10 torr to about 50 torr. Further, the pressure monitors 312 are capable of withstanding large pressure spikes, such as up to 1000 torr for TMA and $H_2O$ precursor materials.

It should be appreciated that features of the embodiment of FIG. 9 may be combined with features of the embodiment of FIGS. 8A and 8B. For example, the dilution mixers 308 and dilution gas source 310 may also be implemented in combination with the pressure monitors 312.

Embodiments may achieve advantages. Through the use of the distribution valves 306, release of precursor gases by the gas injector 106 may be controlled, especially during deposition startup and shutdown sequences. The distribution valves 306 allow precursors to be sequentially introduced to the susceptor as a leading substrate is rotated beneath the gas injector 106. Each of the substrates 50 are thus completely exposed to the precursors during the startup and shutdown sequences, avoiding problems that may arise when one or more of the substrates 50 are partially disposed outside of the process regions 208 during startup and shutdown. Uniformity of the deposited material layer may thus be improved.

In an embodiment, an apparatus includes: a susceptor including substrate pockets; a gas injector disposed over the susceptor, the gas injector having first process regions, the gas injector including a first gas mixing hub and first distribution valves connecting the first gas mixing hub to the first process regions; and a controller connected to the gas injector and the susceptor, the controller being configured to: connect a first precursor material and a carrier gas to the first gas mixing hub; mix the first precursor material and the carrier gas in the first gas mixing hub to produce a first precursor gas; rotate the susceptor to rotate a first substrate disposed in one of the substrate pockets; and while rotating the susceptor, control the first distribution valves to sequentially introduce the first precursor gas at each first process region of the first process regions as the first substrate enters each first process region.

In some embodiments of the apparatus, the controller is located separately from the gas injector. In some embodiments of the apparatus, the controller is co-located with the first distribution valves in the gas injector. In some embodiments of the apparatus, the controller is configured to sequentially introduce the first precursor gas at each first process region by: actuating a respective first valve of the first distribution valves in response to determining the first substrate has entered each first process region. In some embodiments of the apparatus, the controller is further configured to: determine when the first substrate will enter each first process region according to a rotation speed and an initial position of the susceptor. In some embodiments of the apparatus, the gas injector has second process regions, and the gas injector further includes a second gas mixing hub and second distribution valves connecting the second gas mixing hub to the second process regions. In some embodiments of the apparatus, the controller is further configured to: connect a second precursor material and the carrier gas to the second gas mixing hub; mix the second precursor material and the carrier gas in the second gas mixing hub to produce a second precursor gas; and before sequentially introducing the first precursor gas, introduce the second precursor gas at the second process regions of the gas injector. In some embodiments of the apparatus, the controller is further configured to: after introducing the first precursor gas and the second precursor gas, continuing rotation of the susceptor to expose the first substrate to the first process regions and the second process regions, half-reactions of a deposition process for forming a first material layer on the first substrate being performed in the first process regions and the second process regions. In some embodiments of the apparatus, after the first precursor gas and the second precursor gas are introduced, the susceptor is rotated a first quantity of revolutions, the first quantity of revolutions being determined according to a target thickness of the first material layer. In some embodiments of the apparatus, the controller is further configured to: after introducing the first precursor gas and the second precursor gas, control the second distribution valves to sequentially eliminate the second precursor gas from each second process region of the second process regions as the first substrate enters each second process region. In some embodiments of the apparatus, the controller is further configured to: connect the carrier gas to the first distribution valves, thereby further diluting the first precursor gas while introducing the first precursor gas at the first process regions. In some embodiments, the apparatus further includes: a first pressure monitor connected to the first gas mixing hub, the controller being configured to stop processing of the first substrate in response to the first pressure monitor detecting a first pressure in the first gas mixing hub, the first pressure being greater than a predetermined threshold.

In an embodiment, an apparatus includes: a susceptor including substrate pockets; a gas injector disposed over the susceptor, the gas injector having first precursor gas ports and second precursor gas ports; a first precursor material supply connected to the first precursor gas ports; a second precursor material supply connected to the second precursor gas ports; a controller connected to the gas injector and the susceptor, the controller being configured to: start rotation of the susceptor to rotate a first substrate disposed in one of the substrate pockets; introduce a first precursor gas from the first precursor material supply to the first precursor gas ports, the first substrate being exposed to the first precursor gas as the susceptor rotates; and after introducing the first precursor gas, introduce a second precursor gas from the second precursor material supply to the second precursor gas ports, the second precursor gas being sequentially introduced to each second precursor gas port of the second precursor gas ports as the first substrate rotates beneath each second precursor gas port.

In some embodiments of the apparatus, the controller is further configured to: continue rotation of the susceptor to expose the first substrate to the first precursor gas and the second precursor gas, half-reactions of a deposition process for forming a first material layer on the first substrate being performed during exposure to the first precursor gas and the second precursor gas, the rotation of the susceptor being continued until the first material layer includes a predetermined thickness.

In an embodiment, a method includes: starting rotation of a susceptor, the susceptor being disposed beneath a gas injector, the susceptor including substrate pockets, a first substrate being disposed in one of the substrate pockets; introducing a first precursor gas to first process regions of the gas injector, the first substrate being exposed to the first precursor gas as the susceptor rotates; after introducing the first precursor gas, introducing a second precursor gas to second process regions of the gas injector, the second precursor gas being sequentially introduced to each second process region of the second process regions as the first substrate enters each second process region; and after introducing the second precursor gas, continuing rotation of the susceptor to expose the first substrate to the first process regions and the second process regions, half-reactions of a deposition process for forming a first material layer on the first substrate being performed in the first process regions and the second process regions, the rotation of the susceptor being continued until the first material layer includes a predetermined thickness.

In some embodiments, the method further includes: eliminating the first precursor gas from the first process regions of the gas injector, the first precursor gas being sequentially eliminated from each first process region of the first process regions as the first substrate enters each first process region. In some embodiments of the method, the gas injector includes first distribution valves, and introducing the first precursor gas to the first process regions includes: actuating each of the first distribution valves to dispense the first precursor gas in the first process regions. In some embodiments of the method, the gas injector includes second distribution valves, and introducing the second precursor gas to the second process regions includes: determining a time span according to a position and rotation speed of the susceptor; and actuating each of the second distribution valves to dispense the second precursor gas in the second process regions, where actuating includes waiting the time span between actuation of each of the second distribution valves. In some embodiments, the method further includes: mixing a second precursor material with a carrier gas to produce the second precursor gas; and adjusting timing of introduction of the second precursor gas in response to detecting an increase in gas pressure during the mixing. In some embodiments, the method further includes: diluting the second precursor gas with the carrier gas while introducing the second precursor gas to the second process regions of the gas injector.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus comprising:
   a susceptor comprising substrate pockets;
   a gas injector disposed over the susceptor, the gas injector having first process regions and second process regions, the gas injector comprising a first gas mixing hub and first distribution valves connecting the first gas mixing hub to the first process regions, and the gas injector comprising a second gas mixing hub and second distribution valves connecting the second gas mixing hub to the second process regions; and
   a controller connected to the gas injector and the susceptor, the controller being configured to perform the following sequence:

connect a first precursor material and a carrier gas to the first gas mixing hub, and connect a second precursor material and the carrier gas to the second gas mixing hub;

mix the first precursor material and the carrier gas in the first gas mixing hub to produce a first precursor gas, and mix the second precursor material and the carrier gas in the second gas mixing hub to produce a second precursor gas;

rotate the susceptor to rotate a first substrate disposed in a first one of the substrate pockets and a second substrate disposed in a second one of the substrate pockets next to the first substrate, and control the first distribution valves and the second distribution valves to introduce the second precursor gas at all the second process regions of the gas injector while the first precursor gas is not introduced;

while rotating the susceptor, control the first distribution valves to sequentially introduce the first precursor gas at each first process region of the first process regions as the first substrate enters a respective first process region, wherein after a respective first distribution valve of the first distribution valves introduces the first precursor gas at the respective first process region, the respective first distribution valve remains open and continuously supplies the first precursor gas between the first substrate exiting the respective first process region and the second substrate entering the respective first process region;

control the second distribution valves to sequentially eliminate the second precursor gas from each second process region of the second process regions as the first substrate enters a respective second process region; and after the second precursor gas is eliminated from all the second process regions, continue rotation of the susceptor to expose the first substrate and the second substrate to the first precursor gas while the first substrate and the second substrate are not exposed to the second precursor gas.

2. The apparatus of claim 1, wherein the controller is located separately from the gas injector.

3. The apparatus of claim 1, wherein the controller is co-located with the first distribution valves in the gas injector.

4. The apparatus of claim 1, wherein the controller is configured to sequentially introduce the first precursor gas at each first process region by:

actuating a respective first valve of the first distribution valves in response to determining the first substrate has entered each first process region.

5. The apparatus of claim 4, wherein the controller is further configured to:

determine when the first substrate will enter each first process region according to a rotation speed and an initial position of the susceptor.

6. The apparatus of claim 1, wherein the controller is further configured to:

after introducing the first precursor gas and the second precursor gas, continuing rotation of the susceptor to expose the first substrate to the first process regions and the second process regions, half-reactions of a deposition process for forming a first material layer on the first substrate being performed in the first process regions and the second process regions.

7. The apparatus of claim 6, wherein after the first precursor gas and the second precursor gas are introduced, the susceptor is rotated a first quantity of revolutions, the first quantity of revolutions being determined according to a target thickness of the first material layer.

8. The apparatus of claim 1, wherein the controller is further configured to:

connect the carrier gas to the first distribution valves, thereby further diluting the first precursor gas while introducing the first precursor gas at the first process regions.

9. The apparatus of claim 1, further comprising:

a first pressure monitor connected to the first gas mixing hub, the controller being configured to stop processing of the first substrate in response to the first pressure monitor detecting a first pressure in the first gas mixing hub, the first pressure being greater than a predetermined threshold.

10. An apparatus comprising:

a susceptor comprising substrate pockets;

a gas injector disposed over the susceptor, the gas injector comprising precursor gas ports and process regions, wherein the precursor gas ports comprise first precursor gas ports and second precursor gas ports, wherein the process regions comprise first process regions and second process regions, and wherein each first precursor gas port is located within a corresponding one of the first process regions and each second precursor gas port is located within a corresponding one of the second process regions;

a first precursor material supply connected to the first precursor gas ports;

a second precursor material supply connected to the second precursor gas ports;

a controller connected to the gas injector and the susceptor, the controller being configured to perform the following sequence:

start rotation of the susceptor to rotate a first substrate disposed in a first one of the substrate pockets and a second substrate disposed in a second one of the substrate pockets next to the first substrate;

after starting rotation of the susceptor, introduce a first precursor gas from the first precursor material supply to the first precursor gas ports, the first substrate and the second substrate being exposed to the first precursor gas as the susceptor rotates;

after introducing the first precursor gas, introduce a second precursor gas from the second precursor material supply to the second precursor gas ports, the second precursor gas being sequentially introduced to each second precursor gas port of the second precursor gas ports as the first substrate rotates beneath a corresponding one of the second precursor gas ports, wherein after the second precursor gas is introduced to the corresponding one of the second precursor gas ports, a supply of the second precursor gas remains continuously on in a corresponding one of the second process regions between the first substrate exiting the corresponding one of the second process regions and the second substrate entering the corresponding one of the second process regions;

after introducing the second precursor gas, continue rotation of the susceptor to expose the first substrate to the first precursor gas and the second precursor gas, half-reactions of a deposition process for forming a first material layer on the first substrate being performed during exposure to the first precursor gas and the second precursor gas, the rotation of the susceptor being continued until the first material layer comprises a predetermined thickness;

after the first material layer reaches the predetermined thickness, eliminate the first precursor gas from the first precursor gas ports, the first precursor gas being sequentially eliminated from each first precursor gas port of the first precursor gas ports as the first substrate rotates beneath a corresponding one of the first precursor gas ports; and after eliminating the first precursor gas, continue rotation of the susceptor to expose the first substrate and the second substrate to the second precursor gas.

11. The apparatus of claim 10, wherein alternating ones of the first precursor gas ports and the second precursor gas ports are disposed around the gas injector, and wherein the gas injector further comprises purge gas ports, each of the purge gas ports disposed between one of the first precursor gas ports and one of the second precursor gas ports.

12. The apparatus of claim 10, wherein the controller is further configured to:

determine when the first substrate will rotate beneath each of the second precursor gas ports according to a rotation speed and an initial position of the susceptor.

13. The apparatus of claim 10, wherein the controller is further configured to:

dilute the first precursor gas before introducing the first precursor gas to the first precursor gas ports.

14. The apparatus of claim 10, a first pressure monitor connected to the first precursor material supply, the controller being configured to stop processing of the first substrate in response to the first pressure monitor detecting a first pressure in the first precursor material supply, the first pressure being greater than a predetermined threshold.

15. The apparatus of claim 10, wherein a total quantity of the process regions is not a multiple of a quantity of the substrate pockets.

16. An apparatus comprising:

a susceptor;

a gas injector disposed over the susceptor, the gas injector comprising first gas ports and first process regions, wherein each first gas port is located within a corresponding one of the first process regions, first distribution valves connected to the first gas ports and a first supply for a first precursor gas, second gas ports, and second distribution valves connected to the second gas ports and a second supply for a second precursor gas; and a controller connected to the gas injector and the susceptor, the controller being configured to perform the following sequence:

actuate the first distribution valves to supply the first precursor gas to the first gas ports;

rotate the susceptor to rotate a first substrate under the gas injector while the first precursor gas is supplied to the first gas ports and the second precursor gas is not supplied to the second gas ports;

actuate the second distribution valves to supply the second precursor gas to the second gas ports, the second precursor gas being sequentially supplied to each respective second gas port of the second gas ports as a leading edge of the first substrate rotates beneath the respective second gas port;

rotate the susceptor to rotate the first substrate under the gas injector while the first precursor gas is supplied to the first gas ports and the second precursor gas is supplied to the second gas ports;

actuate the first distribution valves to eliminate the first precursor gas from the first gas ports, the first precursor gas being sequentially eliminated from each respective first gas port of the first gas ports as the leading edge of the first substrate enters each corresponding one of the first process regions; and rotate the susceptor to rotate the first substrate under the gas injector while the first precursor gas is not supplied to the first gas ports and the second precursor gas is supplied to the second gas ports.

17. The apparatus of claim 16, wherein first half-reactions of an atomic layer deposition process for forming a dielectric layer on the first substrate are performed when the first substrate is rotated under the first gas ports while the first precursor gas is supplied to the first gas ports, and wherein second half-reactions of the atomic layer deposition process are performed when the first substrate is rotated under the second gas ports while the second precursor gas is supplied to the second gas ports.

18. The apparatus of claim 16, wherein alternating ones of the first gas ports and the second gas ports are disposed around the gas injector, and wherein the gas injector further comprises purge gas ports, each of the purge gas ports disposed between one of the first gas ports and one of the second gas ports.

19. The apparatus of claim 16, wherein the first distribution valves and the second distribution valves are also connected to a supply for a dilution gas, and wherein the controller is further configured to:

actuate the first distribution valves and the second distribution valves to mix the dilution gas with the first precursor gas and the second precursor gas.

20. The apparatus of claim 16, wherein the controller is further configured to:

determine when the first substrate will rotate beneath each of the second gas ports according to a rotation speed and an initial position of the susceptor.

* * * * *